US012002538B2

(12) United States Patent
Kim et al.

(10) Patent No.: US 12,002,538 B2
(45) Date of Patent: Jun. 4, 2024

(54) MEMORY DEVICE WITH DATA MERGERS AND ALIGNER

(71) Applicant: METACNI CO., LTD., Seoul (KR)

(72) Inventors: Young Seung Kim, Seoul (KR); Seung Moon Yoo, Seongnam-si (KR); Min Chul Jung, Seoul (KR)

(\*) Notice: Subject to any disclaimer, the term of this patent is extended or adjusted under 35 U.S.C. 154(b) by 149 days.

(21) Appl. No.: 17/777,010

(22) PCT Filed: Nov. 17, 2020

(86) PCT No.: PCT/KR2020/016166
§ 371 (c)(1),
(2) Date: May 13, 2022

(87) PCT Pub. No.: WO2021/101208
PCT Pub. Date: May 27, 2021

(65) Prior Publication Data
US 2022/0399045 A1    Dec. 15, 2022

(30) Foreign Application Priority Data
Nov. 21, 2019    (KR) .................. 10-2019-0150297

(51) Int. Cl.
*G11C 7/10* (2006.01)

(52) U.S. Cl.
CPC .................. *G11C 7/1066* (2013.01)

(58) Field of Classification Search
CPC . G11C 7/1066; G11C 7/02; G11C 2207/2254; G11C 2207/2272; G11C 7/1006; G11C 7/106; G11C 7/1039; G11C 7/222; G11C 7/06; H03K 5/1534
See application file for complete search history.

(56) References Cited

U.S. PATENT DOCUMENTS

| 2011/0228614 A1 | 9/2011 | Shaeffer et al. |
| 2014/0355358 A1 | 12/2014 | Lee et al. |

FOREIGN PATENT DOCUMENTS

| DE | 102010047378 A1 * | 4/2012 | ......... G01R 31/3658 |
| JP | 2008-130155 A | 6/2008 | |
| JP | 2012-113792 A | 1/2014 | |
| KR | 10-0955285 | 4/2010 | |

OTHER PUBLICATIONS

Method For Monitoring E.g. Temperature Of Battery Cell (Year: 2012).*
English Specification of JP2008-130155A.
English Specification of JP2012-113792A.
English Specification of 10-0955285.

\* cited by examiner

*Primary Examiner* — Sultana Begum
(74) *Attorney, Agent, or Firm* — ANTONIO HA & U.S. PATENT, LLC

(57) ABSTRACT

A memory device may comprise: a memory cell array in which memory cells are connected in matrix form to word lines and bit lines; a plurality of mergers connected in series to transfer data that is read from a selected memory cell among the memory cells included in the memory cell array and is transformed into one of a direct current form or a pulse form; and an aligner that synchronizes an edge of first output data, output by one of the plurality of mergers, with an edge of a control pulse, thereby delaying the edge of the first output data.

11 Claims, 16 Drawing Sheets

FIG. 12
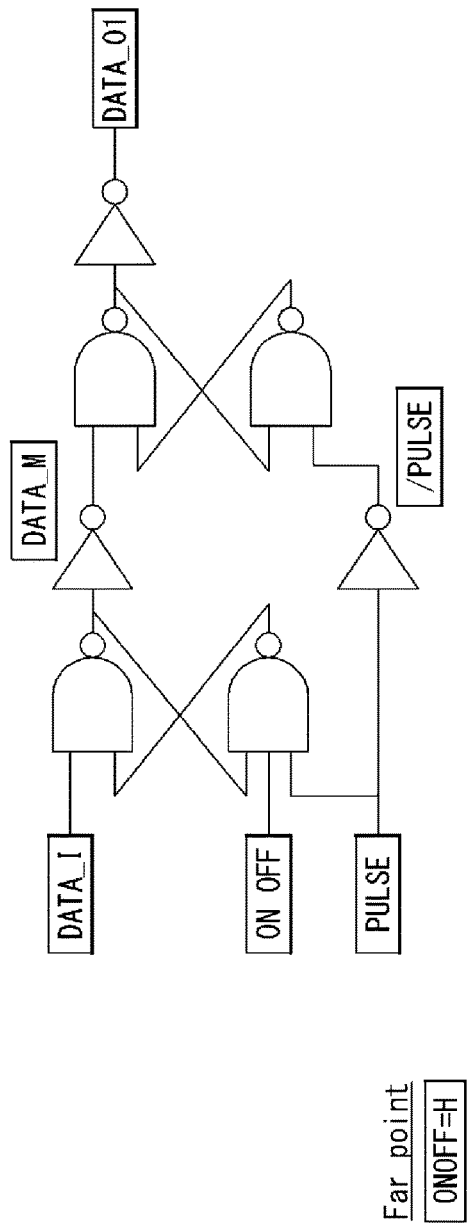
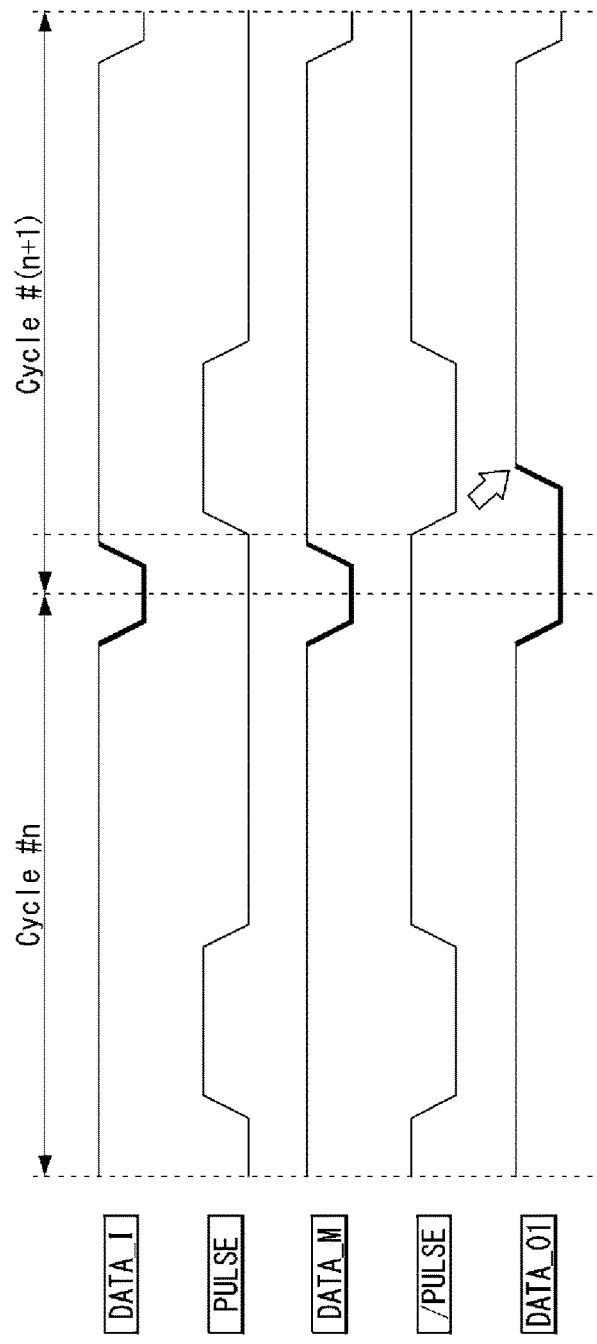

FIG. 13
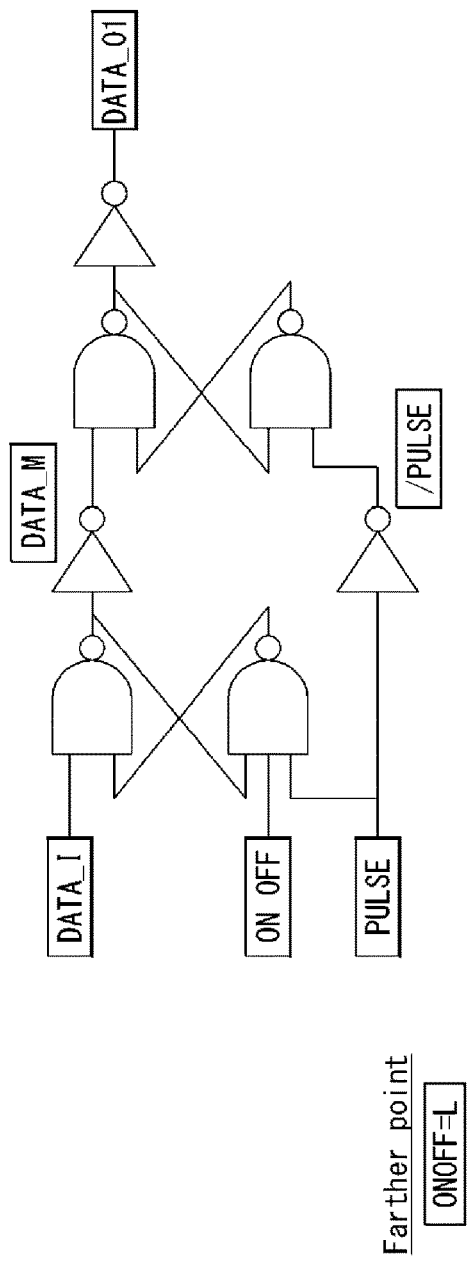
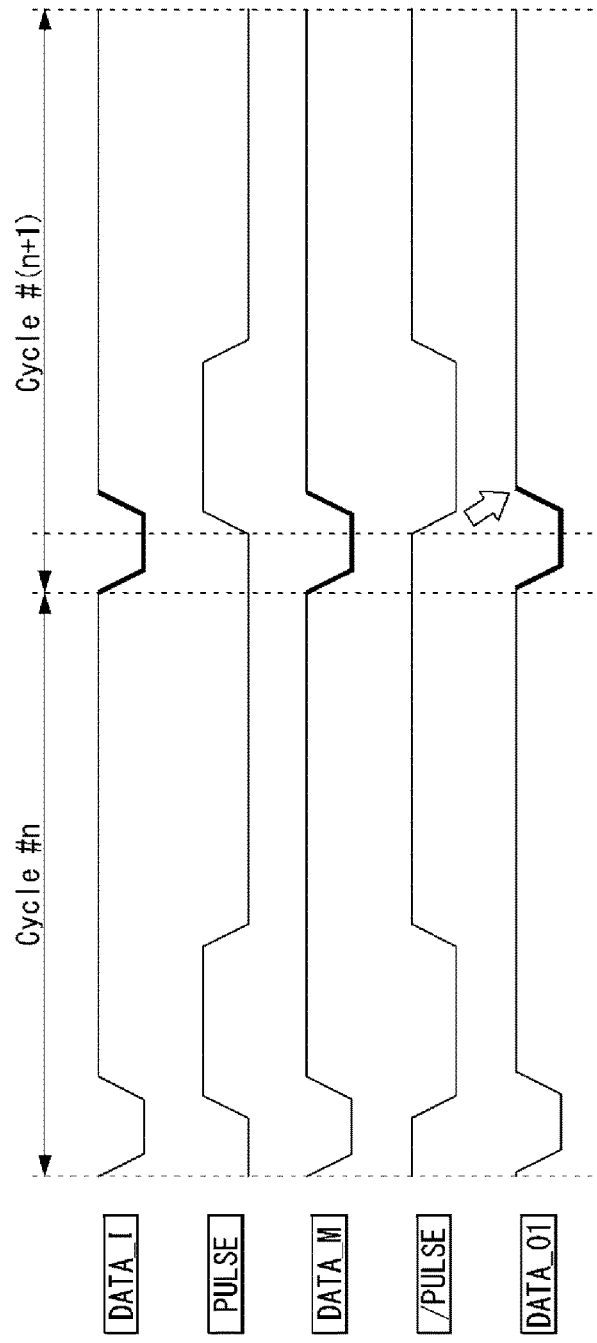

FIG. 16
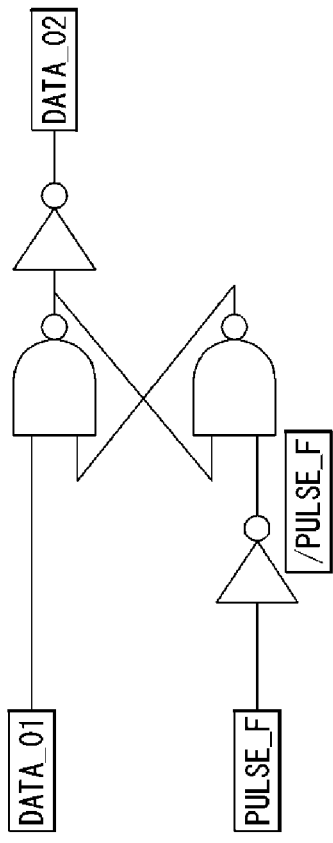
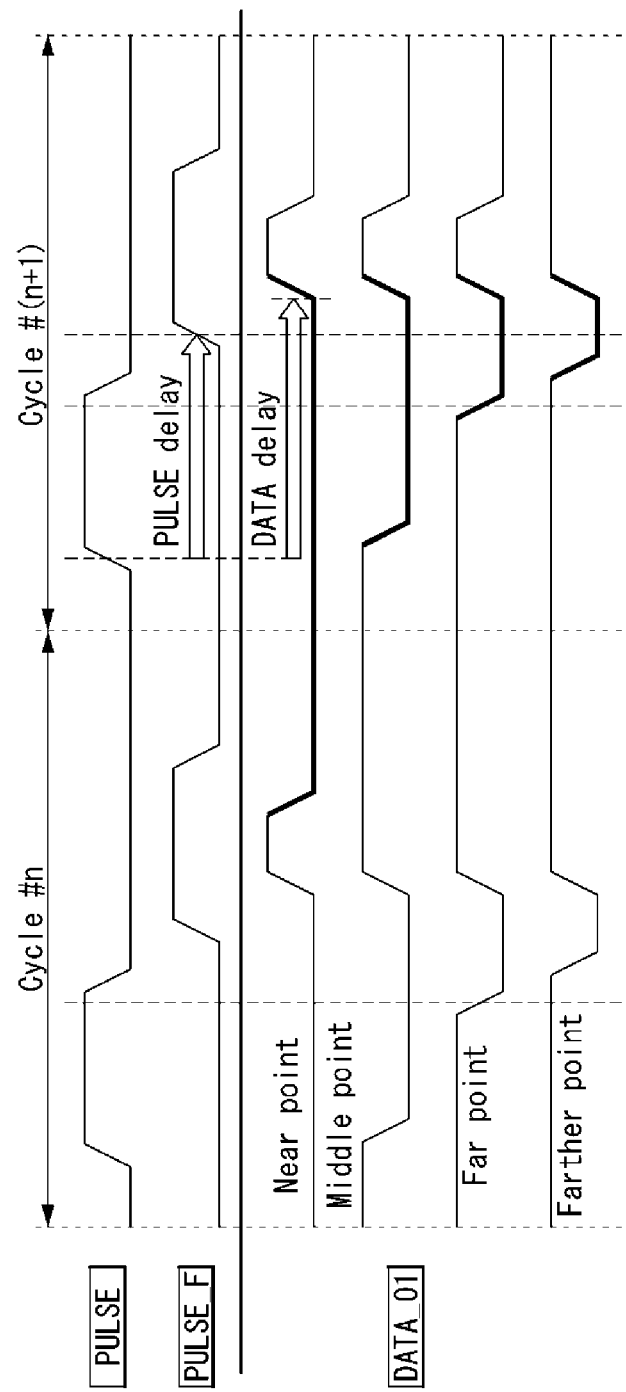

MEMORY DEVICE WITH DATA MERGERS AND ALIGNER

CROSS-REFERENCE TO RELATED APPLICATIONS

This application is the National Stage filing under 35 U.S.C. 371 of International Application No. PCT/KR2020/016166, filed on Nov. 17, 2020, which claims the benefit of Korean Application No. 10-2019-0150297 filed on Nov. 21, 2019, the contents of which are all hereby incorporated by reference herein in their entirety.

STATEMENT REGARDING GOVERNMENT-SPONSORED RESEARCH OR DEVELOPMENT

This application is one of the results of Next-generation intelligent semiconductor technology development (design, manufacturing) R&D (Project No. 1415169966 (2020 Apr. 1-2020 Dec. 31), Project Name: Development of integrated display SoC for 8K and 120 Hz high-definition ARVR) hosted by Ministry of Trade, Industry and Energy (MOTIE) and Korea Evaluation Institute of Industrial Technology (KEIT) in Republic of Korea.

TECHNICAL FIELD

This document relates to a memory device, and more particularly, to a device for managing skew in a memory.

BACKGROUND ART

In a semiconductor device that provides both a memory and a non-memory on a single chip, the larger the area occupied by a memory region, the more important it is to reduce the size of the memory region in order to increase price competitiveness of the semiconductor device.

The memory device provides a data register for temporarily storing data read from or to be stored in a cell array for each memory cell array in which memory cells are connected to bit lines and word lines in a matrix form.

As the size of the memory cell array for which the data register is responsible increases, the area occupied by the memory region decreases and current consumption during operation can be reduced.

However, when the size of the cell array increases, a problem may occur due to a delay due to a difference in signal delay between a distant and a near location in accessing the cell array. In other words, when the data register accesses a close memory cell and a far-away memory cell in the cell array, the time deviation or skew of the data arriving at the data register increases, making the design of the memory device difficult. So, a device to compensate for this must be added.

DISCLOSURE

Technical Problem

This disclosure has been made in view of this situation, and an object of this disclosure is to provide a memory device in which the size of the memory region is decreased.

Another object of this disclosure is to provide a skew management apparatus for managing skew occurring when a distance between a memory cell array and a data register is increased.

Technical Solution

The memory device according to an embodiment of this disclosure may comprise a memory cell array in which memory cells are connected to word lines and bit lines in a matrix form, a plurality of mergers connected in series to transmit data that is read from a selected memory cell from among the memory cells included in the memory cell array and transformed into one of a direct current form and a pulse form, and an aligner configured to delay an edge of first output data output by one of the plurality of mergers in synchronization with an edge of a control pulse.

Advantageous Effects

By reducing the number of stages of data register arrays provided from a memory cell array to a data pad, data latency can be reduced, the size of a memory device can be reduced, and the area occupied by the memory cell array can be relatively increased, thereby increasing the degree of integration and securing price competitiveness.

In addition, by reducing the stages of the data register arrays, it is possible to better manage data skew that occurs as the memory cell array in charge of the data register array grows, so that it is possible to secure stable performance of the memory device.

DESCRIPTION OF DRAWINGS

FIG. 12 is a diagram illustrating a result of processing data output from the memory cell array located far from a first aligner by the first aligner, FIG. 13 is a diagram illustrating a result of processing data output from the memory cell array located at a greater distance from a first aligner by the first aligner, FIG. 16 shows the timing of data input from the first aligner to the second aligner according to the distance from the second aligner.

BEST MODE

Figure 1:
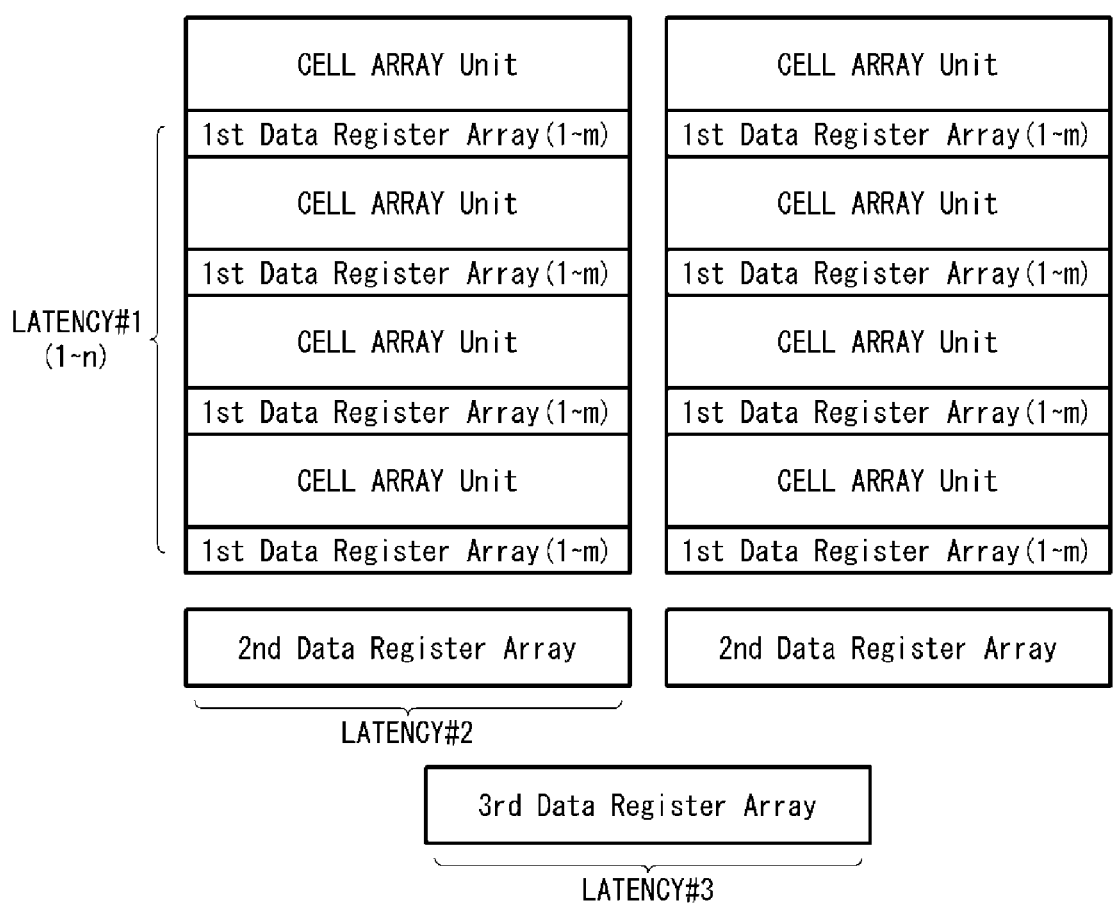
FIG. 1 shows the structure of the memory device in which data register arrays are provided in a multi-stage manner to generate latency.

Various embodiments of the memory device of this disclosure will be simply and clearly described as follows.

The memory device of this disclosure may comprise a memory cell array in which memory cells are connected to word lines and bit lines in a matrix form, a plurality of mergers connected in series to transmit data that is read from a selected memory cell from among the memory cells included in the memory cell array and transformed into one of a direct current form and a pulse form, and an aligner configured to delay an edge of first output data output by one of the plurality of mergers in synchronization with an edge of a control pulse.

In an embodiment, the merger may output data by merging output of a previous merger and output of a corresponding sense amplifier.

In an embodiment, first data which is one of data bit '0' and data bit '1' may be input to the merger in the direct current form of first logic and second data which is the other of the data bit '0' and the data bit '1' may be input to the merger in the pulse form in which the first logic is changed through second logic back to the first logic.

In an embodiment, when the first data is input, the aligner may pass the first data to output the direct current form of the first logic as second output data, and when a first edge changing from the second logic to the first logic, the aligner may output the first edge with a delay as the second output data in synchronization with a rising edge or a falling edge of the control pulse.

In an embodiment, wherein the aligner may include first and second edge delay units connected in series. The first edge delay unit may receive the first output data and the control pulse as inputs, delay a first edge occurring in the first output data during the control pulse is at the first logic, and output the first edge as intermediate data when the control pulse changes from the first logic to the second logic. The second edge delay unit may receive the intermediate data and an inverted control pulse inverting the control pulse as inputs, delay the first edge occurring in the intermediate data during the inverted control pulse is at the first logic, and output the first edge as second output data when the inverted control pulse changes from the first logic to the second logic.

In an embodiment, the first logic may be logic high and the second logic may be logic low. The first edge delay unit may include a first NAND gate receiving the first output data and output of a second NAND gate as inputs, the second NAND gate receiving the control pulse and output of the first NAND gate as inputs, and a first NOT gate inverting the output of the first NAND gate to output the intermediate data. The second edge delay unit may include a third NAND gate receiving the intermediate data and output of a fourth NAND gate as inputs, the fourth NAND gate receiving the inverted control pulse and output of the third NAND gate as inputs, and a second NOT gate inverting the output of the third NAND gate to output the second output data.

In an embodiment, the second NAND gate further may receive an on-off control signal enabling or disabling an operation of the first edge delay unit as the inputs, and the on-off control signal may be input as logic low when a requested address of a memory cell is relatively far from the aligner.

In an embodiment, the memory device may further comprise: a plurality of memory cell arrays; a plurality of first aligner arrays comprising a plurality of aligners each of which is connected to one of the memory cells and a plurality of second mergers each of which is connected a corresponding one of the plurality of aligners; and a second aligner array comprising a plurality of second aligners each of which is connected to one of the plurality of second mergers included in one among the plurality of first aligner arrays.

In an embodiment, the second aligner may delay an edge of second output data output from a corresponding second merger by using a feedback control pulse fed back from the plurality of aligners included in the plurality of first aligner arrays.

In an embodiment, the second aligner may receive the second output data and the feedback control pulse as inputs, pass the first data as it is to output the first data as third output data of the direct current form of the first logic when the first data is input as the second output data, delay the first edge occurring in the second output data during an inverted feedback control pulse inverting the feedback control pulse is the first logic, and output the first edge as the third output data when the inverted feedback control pulse changes from the first logic to the second logic.

In an embodiment, the second aligner may comprise a fourth NOT gate inverting the feedback control pulse to output the inverted feedback control pulse, a fifth NAND gate receiving the second output data and output of a sixth NAND gate as inputs, the sixth NAND gate receiving the inverted feedback control pulse and output of the fifth NAND gate as inputs, and a fifth NOT gate inverting the output of the fifth NAND gate.

In an embodiment, the second merger may comprise a seventh NAND gate receiving output of a previous second merger and output of a corresponding aligner as inputs, and a sixth NOT gate inverting output of the seventh NAND gate.

MODE FOR INVENTION

Hereinafter, preferred embodiments of the memory device and the method of driving a memory according to this disclosure will be described in detail with reference to the accompanying drawings.

Like reference numbers throughout the specification refer to substantially the same elements. In the following description, if it is determined that a detailed description of a known function or configuration related to this disclosure may unnecessarily obscure the gist of this disclosure, the detailed description thereof will be omitted.

Figure 2:
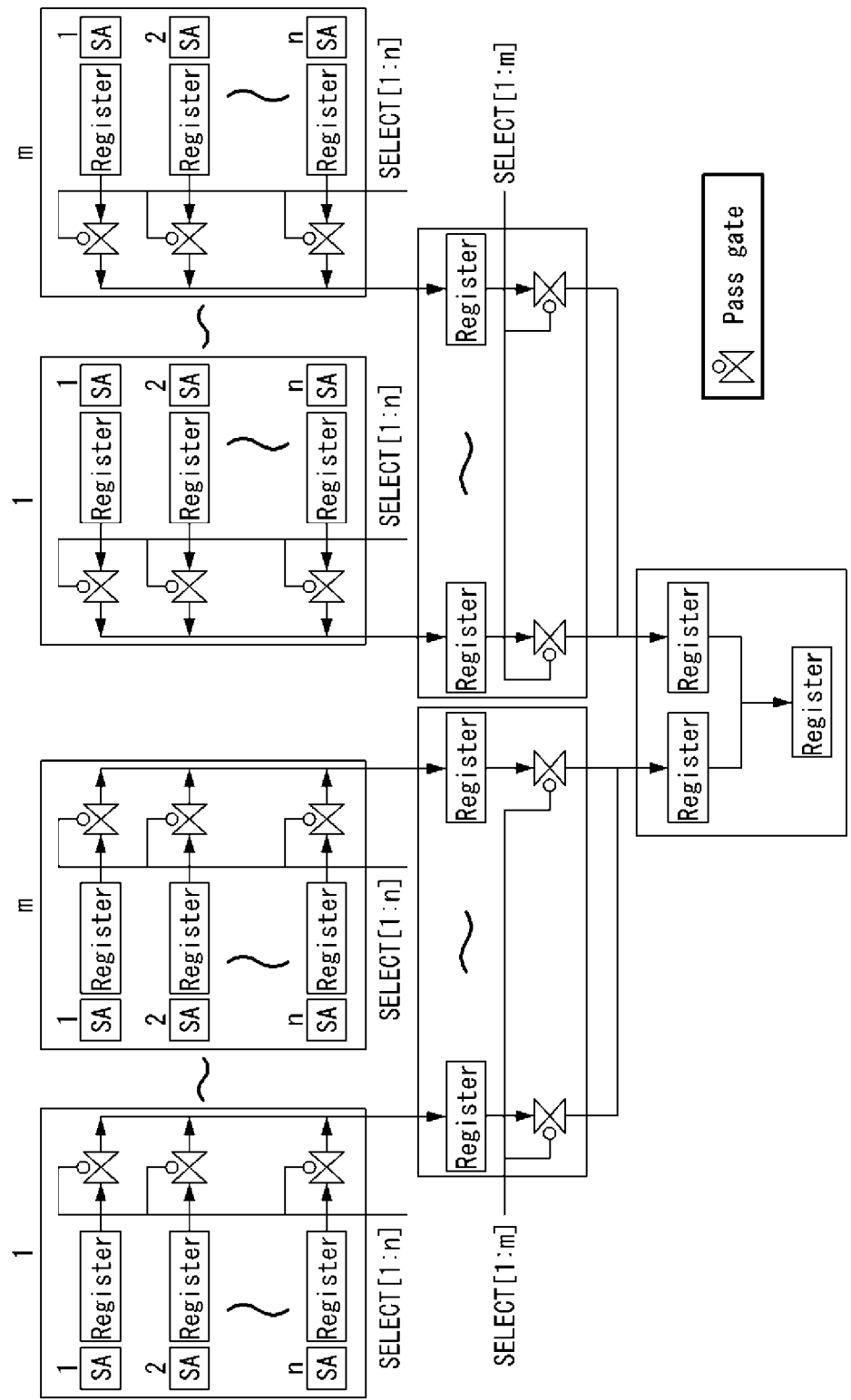
FIG. 2 shows the specific configuration of the memory device of FIG. 1.

FIG. 1 shows the structure of the memory device in which data register arrays are provided in a multi-stage manner to generate latency, and FIG. 2 shows the specific configuration of the memory device of FIG. 1.

In FIG. 1, a first data register array composed of m first data registers latching the outputs of sense amplifiers SA for each cell array unit in which memory cells are provided in a matrix form is provided. A second data register array composed of m second data registers which select and receive one from among a plurality of, for example, n first data outputs received as an input is provided. A third data register selects and receives one from among a plurality of, for example, m outputs of the second data register as an input, and the third data register on the left and the third data register on the right are integrated into one to form a third data register array.

The first data register temporarily stores data stored in the memory cells selected in a corresponding cell array unit, and the second data register temporarily stores data temporarily stored in corresponding first data registers. The third data register stores data temporarily stored in corresponding second data registers, and then transfers the data to a data output buffer that transfers the data to a host.

That is, a memory device places data registers of multiple stages in the data flow from the memory cells to final data pads and accesses the memory cell array by temporarily storing data in stages based on clock-based pulses. And it is said that the data input/output speed is increased by using latency.

In FIG. 2, 1 to n first data registers are arranged in the column direction, 1 to m second data registers are arranged in the row direction, and the third data register array is arranged for the left and right two second data register arrays.

As shown in FIG. 2, the data register consists of a plurality of registers and a pair of pass gates. The sense amplifier SA of the memory cell array amplifies the data read from the selected memory cell and transmits it to the corresponding register of the first data register, and the pass gate of the first data register is selected by the select signal SELECT[1:n] to transfer data to the corresponding register of the second data register. The pass gate of the second data register is also selected by the selection signal SELECT[1:m] to transfer the data stored in the register to the corresponding register of the third data register.

Figure 3:
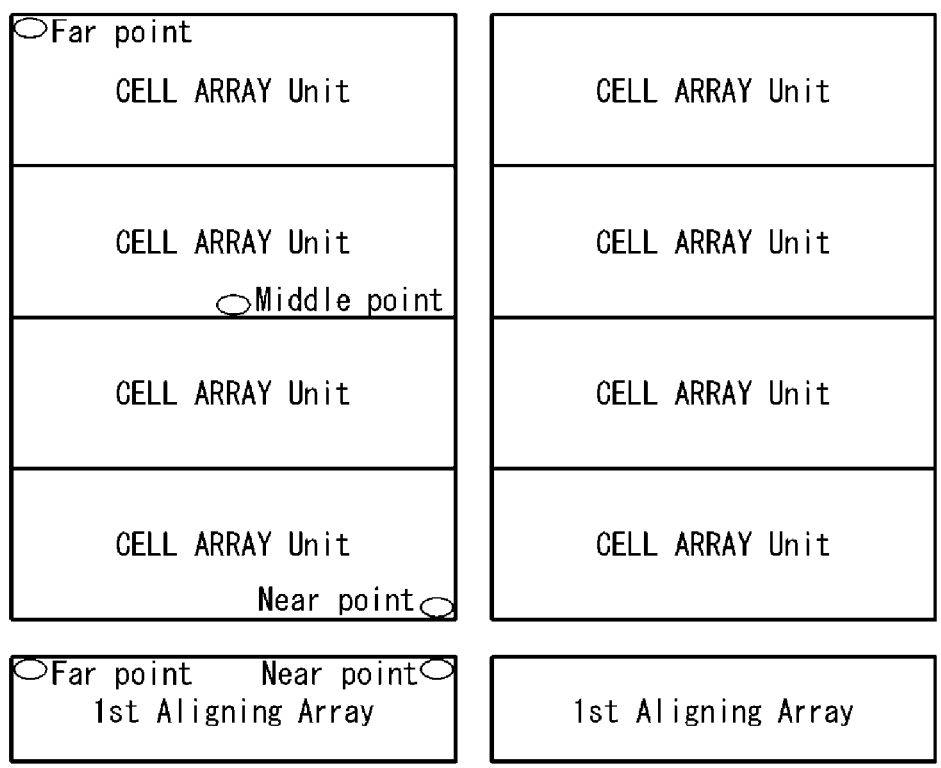
FIG. 3 shows the configuration of the memory device employing an alignment array and a data register array.
Figure 4:
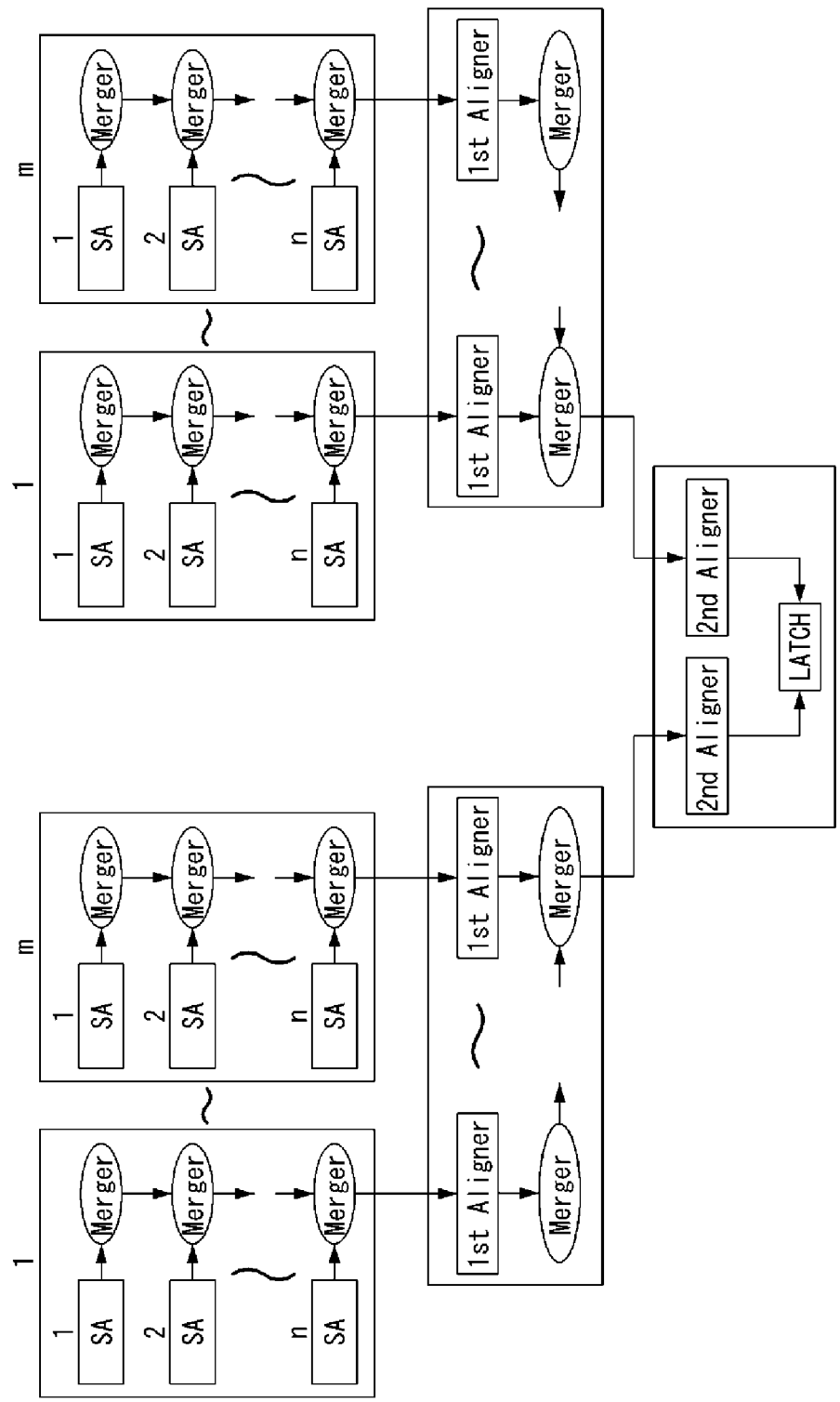
FIG. 4 shows the specific configuration of the memory device of FIG. 3.

However, as shown in FIGS. 1 and 2, data input/output goes through three-stage data registers, and the first data register array is disposed between the cell array units. As a result, the chip size increases, and cycle limit comes quickly because a margin must be secured at each latency stage.
DDD FIG. 3 shows the configuration of the memory device employing an alignment array and a data register array, and FIG. 4 shows the specific configuration of the memory device of FIG. 3. The configurations of FIGS. 3 and 4 correspond to a structure for reducing the chip size of the memory device by providing fewer data register arrays than those of FIGS. 1 and 2.

In FIG. 3, first and second aligning arrays are provided at two points between a data register array and a memory cell array to form a primary data register array and several memory cells, which makes it possible to efficiently manage the skew resulting from the difference in physical distances between the first data register array and the many memory cells. That is, the first aligning array may manage the skew generated in the memory cell array, and the second aligning array may manage the skew generated in the first aligning array.

As shown in FIG. 4, in each memory cell array 1 to n n first mergers are provided in the column direction, the first aligning array comprising 1 to m pairs of a first aligner and a second merger arranged in the row direction is provided, and for the two first aligning arrays on the left and right, two secondly aligners are placed together with data registers as a second aligning & data register array.

The output of the first mergers connected in a chained manner in each memory cell array is linked to the corresponding first aligner. In the first aligning array, the first aligner is linked to the corresponding second merger, and the second mergers are connected in the chained manner. The output of the second mergers connected in the chained manner in each first aligning array is linked to the corresponding second aligner in the second aligning array.

The second aligning & data register array latches and temporarily stores the output of each second aligner.

Figure 5:
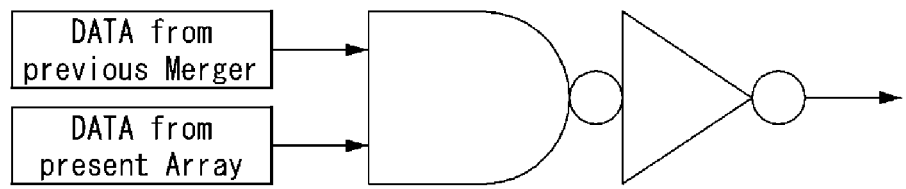
FIG. 5 shows the logic circuit of the merger included in the memory device of FIG. 4.
Figure 6:
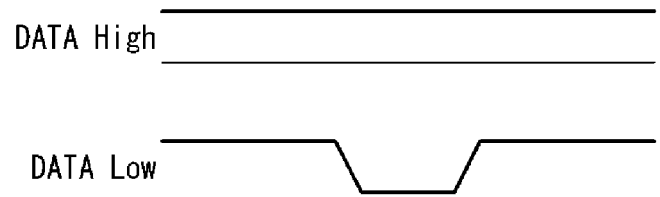
FIG. 6 shows the waveform of the data input to the merger of FIG. 5.
Figure 7:
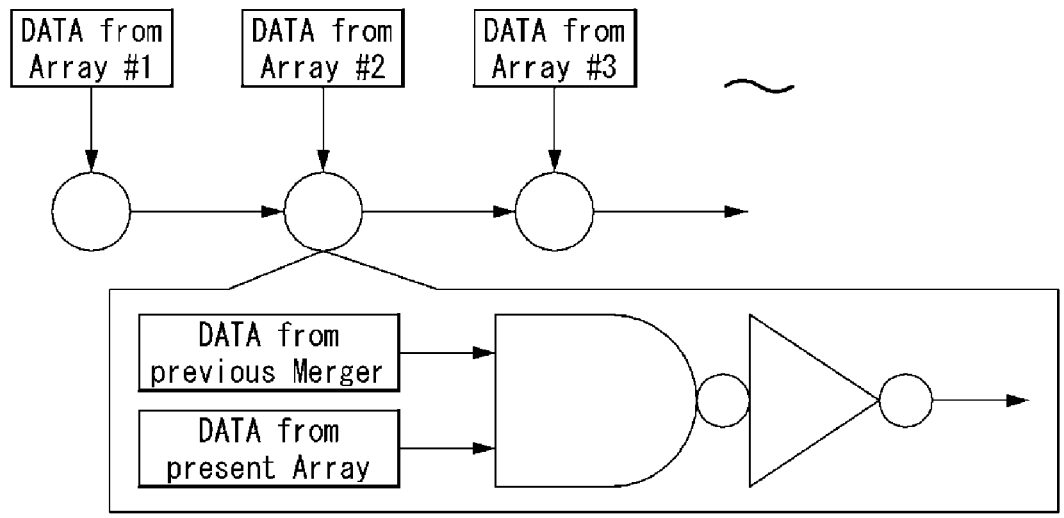
FIG. 7 shows the specific connection of the merger of FIG. 5.

FIG. 5 shows the logic circuit of the merger included in the memory device of FIG. 4, FIG. 6 shows the waveform of the data input to the merger of FIG. 5, and FIG. 7 shows the specific connection of the merger of FIG. 5.

In the merger, a NAND logic element (or NAND gate) and a NOT logic element (or NOT gate) are connected in series, and the input of the NAND gate is the output of a previous merger and the data output of the current array or the data output of a current sense amplifier SA.

As shown in FIG. 6, the waveform of the output of the sense amplifier SA maintains a logic high for data high (DATA High) indicating a data bit '1' and has the form of a low pulse in which a level falls from a high state to a low state and then changes back to the high state for data low (Data Low) indicating a data bit '0'.

Only one array (or sense amplifier) is selected for each cycle corresponding to a data reading speed and outputs either data high or data low. Respective mergers are connected in series in such a way that the output of the previous merger and the output of the corresponding current array (or sense amplifier) are merged as shown in FIG. 7. The final merger may output the data waveform of FIG. 6 output by the array (sense amplifier) selected in the corresponding cycle as it is.

Figure 8:
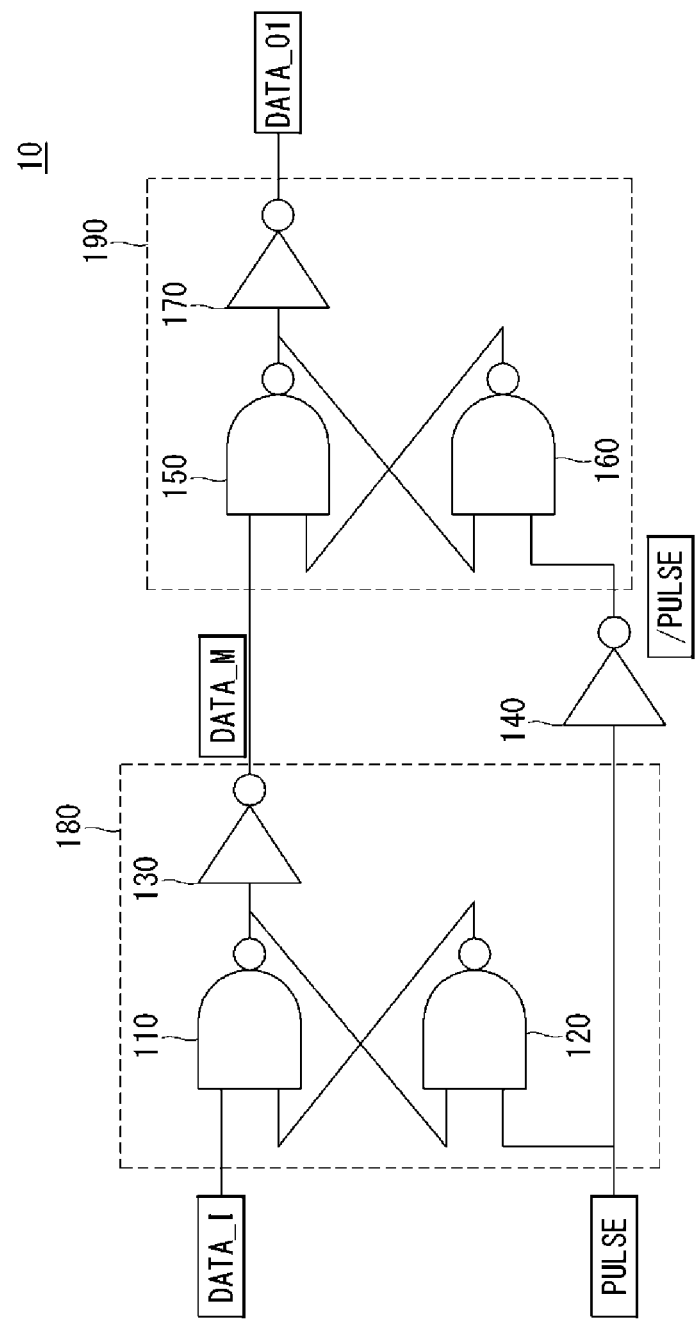
FIG. 8 shows the logic circuit of the primary aligner included in the memory device of FIG. 4.

FIG. 8 shows the logic circuit of the primary aligner included in the memory device of FIG. 4.

The first alinger 10 may comprise the first NAND gate 110 that receives input data DATA_I and the output of the second NAND gate 120, the second NAND gate 120 that receives the control pulse PULSE and the output of the first NAND gate 110, a first NOT gate 130 that inverts the output of the first NAND gate 110, a second NOT gate 140 that inverts the control pulse PULSE, a third NAND gate 150 that receives the output DATA_M of the first NOT gate 130 and the output of the fourth NAND gate 160, the fourth NAND gate 160 that receives the output of the third NAND gate 150 and the output/PULSE of the third NOT gate 140, and the third NOT gate 170 that inverts the output of the third NAND gate 150.

When receiving the data high (DATA High) maintaining the logic high in FIG. 6 as the input data DATA_I, the first aligner 10 outputs, as final output data, that is, the output DATA_O1 of the third NOT gate 170, the data high Data High which is the input data DATA_I as it is.

On the other hand, when the data low DATA Low in the form of the low pulse in FIG. 6 is input as the input data DATA_I, the first aligner 10 output the rising edge of the low pulse by delaying it in synchonization with the control pulse PULSE. That is, even though the time point at which the low level of the pulse is maintained even if the time point at which the input data in the form of the low pulse is input varies on the time axis according to the location of the selected cell array or the location of the memory cell in a same cell array, a time point at which the low level of the pulse is maintained may be synchronized with the control pulse PULSE.

In the first aligner 10, the first NAND gate 110, the second NAND gate 120 and the first NOT gate 130 correspond to the first edge delay unit 180, the third NAND gate 150, the fourth NAND gate 160, and the third NOT gate 170 correspond to the second edge delay unit 190, and the second NOT gate 140 inverts the control pulse PULSE to generate an inverted control pulse/PULSE and outputs it to the second edge delay unit 190.

If the low pulse is input to the first NAND gate 110 as the input data DATA_I during a period in which the control pulse PULSE input to the second NAND gate 120 is logic high, the first edge delay unit 180 delays the rising edge in the low pulse of the input data DATA_I so that when the control pulse PULSE falls to logic low, the first NOT gate 130 outputs a rising edge as the intermediate output data DATA_M.

Figure 9:
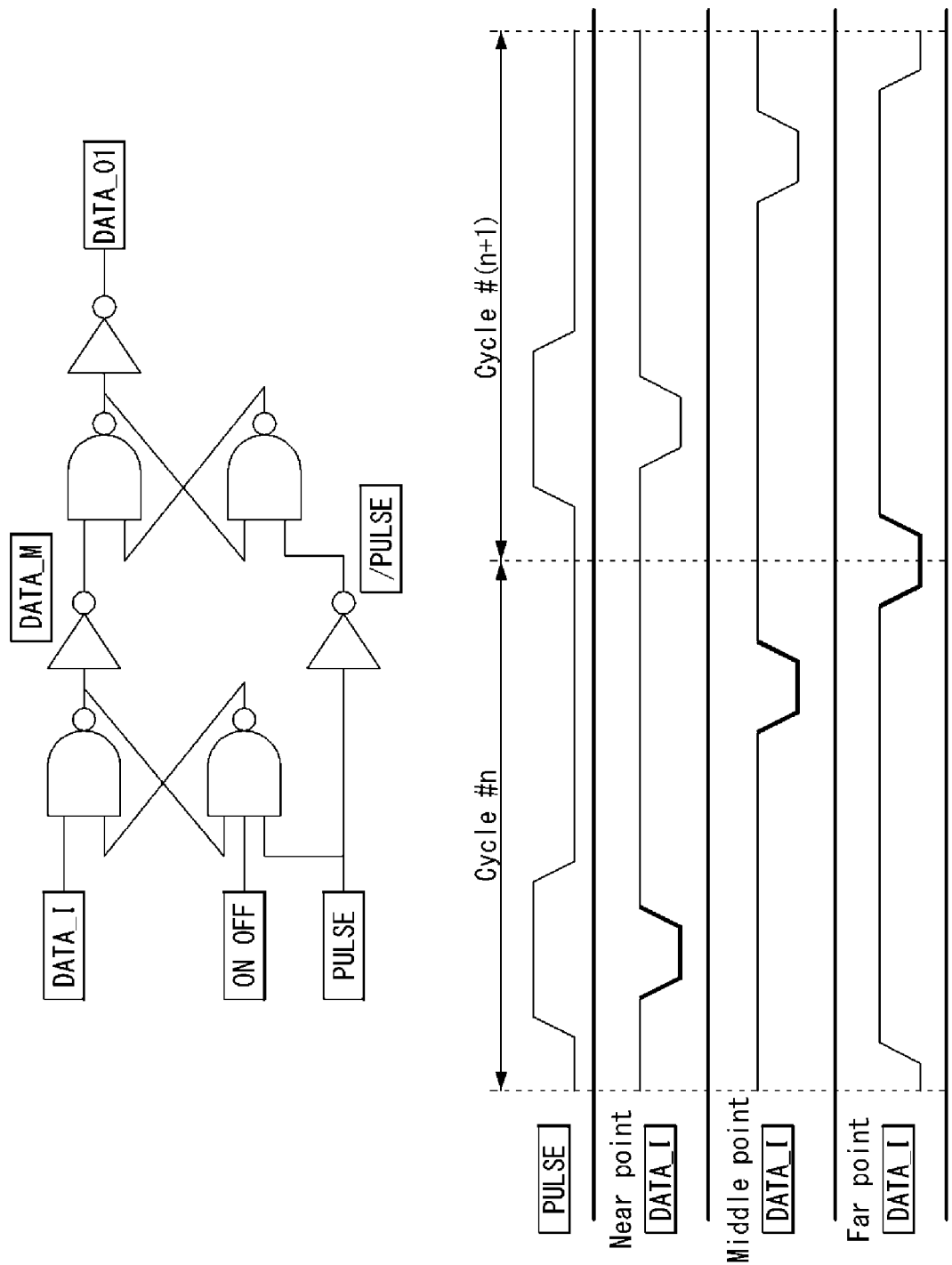
FIG. 9 shows that the timing of data input to a first aligner varies according to the distance from the first aligner of FIG. 8.

If the intermediate output data DATA_M of the first edge delay unit 180 is input to the third NAND gate 150 at a low level while the inversion control pulse/PULSE input to the fourth NAND gate 160 is logic high, the second edge delay unit 190 is configured such that the third NOT gate 170 outputs a rising edge as the first aligner output data DATA_O1 when the inverted control pulse/PULSE falls from logic high to logic low.
DDD
FIG. 9 shows that the timing of data input to a first aligner varies according to the distance from the first aligner of FIG. 8. As shown in FIG. 3, the uppermost cell array unit among the plurality of cell array units is located far away from the first aligner provided in the first aligning array (Far point), the lowermost cell array unit is located close to the first aligner (Near point), and the center cell array unit is located at an intermediate distance from the first aligner (Middle point).

As shown in FIG. 9, the most delay occurs in data transmitted from the memory cell (far point) located far from the first aligner, and the data transmitted from the memory cell (near point) located close to the first aligner has the least delay.

In FIG. 9, the logic low of the low pulse data DATA_I transmitted from the near memory cell (Near point) overlaps the logic high of the control pulse PULSE, and the low pulses transmitted from the memory cell at the middle distance (Middle point) and the memory cell at the far distance (far point) do not overlap the logic high of the control pulse PULSE.

Figure 10:
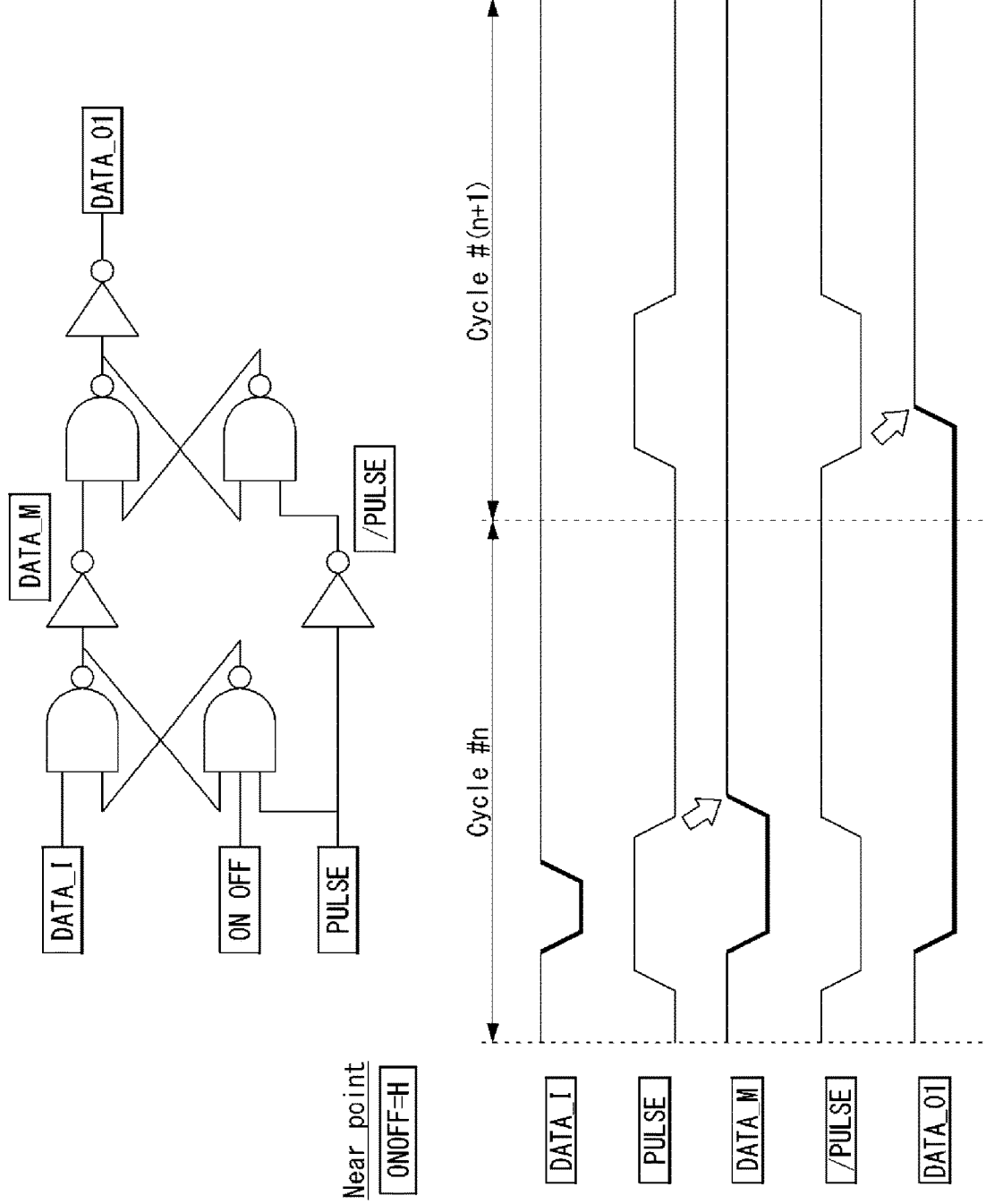
FIG. 10 is a diagram illustrating a result of processing data output from the memory cell array located close to a first aligner by the first aligner.

FIG. 10 is a diagram illustrating a result of processing data output from the memory cell array located close to a first aligner by the first aligner.

In FIG. 10, the input data DATA_I transferred from the memory cell array located at a close distance from the first aligner through the first merger is input, for example, as the data low DATA Low having the low pulse in the nth cycle (Cycle #n) and as the data high DATA High maintaining logic high in the (n+1)th cycle (Cycle #(n+1)). In the n-th cycle (Cycle #n), the input pulse of the input data DATA_I transmitted from the near point close to the first aligner has a small delay and overlaps with the logic high section of the control pulse PULSE.

While the control pulse PULSE is logic high, if the input data DATA_I is logic low, the first edge delay unit 180 reflects it as it is and outputs the intermediate output data DATA_M of the logic low, and if the input data DATA_I is changed from logic high to logic low, the first edge delay unit 180 reflects it as it is and outputs the intermediate output data DATA_M that is changed from logic high to logic low.

However, even if the input data DATA_I changes from logic low to logic high while the control pulse PULSE is logic high, the first edge delay unit 180 does not reflect it and outputs the intermediate output data DATA_M of the logic low.

Instead, when the input data DATA_I has logic low even during at least a section among the period in which the control pulse PULSE is logic high, the first edge delay unit 180 outputs the intermediate output data DATA_M of logic low during a period in which the control pulse PULSE is high logic, and outputs a rising edge rising from logic low to logic high as the intermediate output data DATA_M when the falling edge of the control pulse PULSE falling from logic high to logic low.

The second edge delay unit 190 receives the intermediate output data DATA_M, which is the output of the first edge delay unit 180, and the inverted control pulse/PULSE as inputs and outputs the first aligner output data DATA_O1. The operation of the second edge delay unit 190 is the same as that of the first edge delay unit 180 except that the inverted control pulse/PULSE is input instead of the control pulse PULSE.

So, when the intermediate output data DATA_M has logic low even during at least a section among the period in which the inverted control pulse/PULSE is logic high and the inverted control pulse/PULSE falls from logic high to logic low, the second edge delay unit 190 outputs a rising edge rising from logic low to logic high as the first aligner output data DATA_O1.

In FIG. 10, the logic low section of the low pulse overlaps the logic high section of the control pulse PULSE because the input data DATA_I transmitted from the near point has a low delay. Accordingly, when the input data DATA_I changes from logic high to logic low, the intermediate output data DATA_M of the first edge delay unit 180 reflects it and changes from logic high to logic low, when the input data DATA_I changes from logic low to logic high then is changed from logic low to logic high, the intermediate output data DATA_M of the first edge delay unit 180 maintains the logic low, and when the control pulse PULSE changes from logic high to logic low, the intermediate output data DATA_M of the first edge delay unit 180 changes from logic low to logic high.

When the control pulse PULSE changes from logic high to logic low, the inverted control pulse/PULSE is changed from logic low to logic high, and also the intermediate output data DATA_M is changed from logic low to logic high. However, since the transition of the intermediate output data DATA_M is delayed than the transition of the inverted control pulse and the intermediate output data DATA_M maintains logic low for an initial moment when the inverted control pulse/PULSE maintains logic high, the first aligner output DATA_O1, which is the output of the second edge delay unit 190, maintains logic low while the inverted control pulse/PULSE maintains logic high.

The first aligner output DATA_O1, which is the output of the second edge delay unit 190, is changed from logic low to logic high when the inverted control pulse/PULSE changes from logic high to logic low.

Accordingly, the first aligner output data DATA_O1, which is the output data of the second edge delay unit 190, falls from logic high to logic low as same as the input data DATA_I when the input data DATA_I falls from logic high to logic low, maintains the low logic, and rises from logic low to logic high when the inverted control pulse/PULSE falls from logic high to logic low.

That is, the first aligner output data DATA_O1 outputs a rising edge in synchronization with the falling edge of the inverted control pulse/PULSE.

Figure 11:
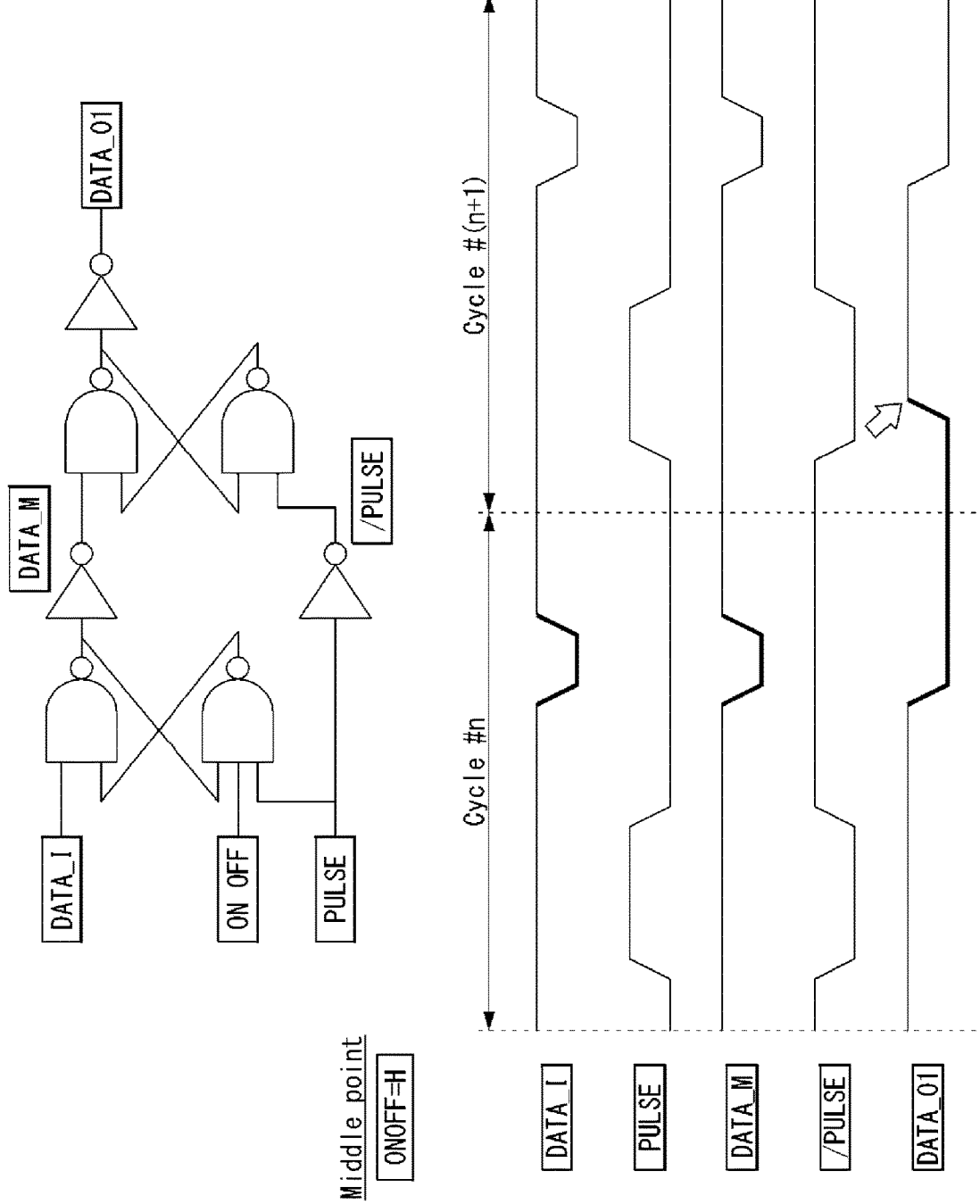
FIG. 11 is a diagram illustrating a result of processing data output from the memory cell array located at an intermediate distance from a first aligner by the first aligner.

FIG. 11 is a diagram illustrating a result of processing data output from the memory cell array located at an intermediate distance from a first aligner by the first aligner.

In FIGS. 11 and 12, the input data DATA_I transferred from the memory cell array located at the middle point and the far point from the first aligner through the first merger is input as data low DATA Low having the low pulse.

The low pulse of the input data DATA_I transmitted from the memory cell array located at an intermediate distance and a long distance from the first aligner is delayed while passing through a plurality of first mergers and may arrive after the logic high section of the control pulse PULSE.

In FIGS. 11 and 12, since the input data DATA_I is logic high while the control pulse PULSE is logic high, the first edge delay unit 180 outputs the intermediate output data DATA_M as the same logic high as the input data DATA_I.

And, in the first edge delay unit 180, since the output of the second NAND gate 120 is unconditionally high while the control pulse PULSE is logic low, the output of the first NOT gate 130 passing through the first NAND gate 110 becomes the same logic as the input data DATA_I. So, the first edge delay unit 180 outputs, as the intermediate output data DATA_M, the input data DATA_I as it is while the control pulse PULSE is logic low. That is, when the low pulse is input as the input data DATA_I, the first edge delay unit 180 outputs the low pulse as the intermediate output data DATA_M.

FIGS. 11 and 12, while the inverted control pulse/PULSE of logic high is input to the second edge delay unit 190, the intermediate output data DATA_M of the low pulse is transmitted to the second edge delay unit 190.

While the inverted control pulse/PULSE is logic high, the second edge delay unit 190 outputs logic high, the falling edge from logic high to logic low and logic high of the input intermediate output data DATA_M as it is as the first aligner output data DATA_O1.

On the other hand, while the inverted control pulse/PULSE is logic high, the second edge delay unit 190 delays the rising edge from logic low to logic high of the input intermediate output data DATA_M to continuously output the logic low as the primary sorter output data DATA_O1, as it is as the first aligner output data DATA_O1. That is, the second edge delay unit 190 delays the rising edge until the inverted control pulse/PULSE changes from logic high to logic low.

As shown in FIGS. 10 to 12, the timings when the input data of the low pulse is input to the first aligner are different because the distances from the first aligner to the memory cell arrays are different, but the rising edge output of the second edge delay unit 190 is delayed in synchronization with the falling edge of the inverted control pulse/PULSE.

Accordingly, even if the area of the memory cell array in charge of the first aligner is widened, the data level can be maintained up to a predetermined time point regardless of the location of the memory cell to be accessed, thereby overcoming the skew.

DDD

FIG. 13 is a diagram illustrating a result of processing data output from the memory cell array located at a greater distance from a first aligner by the first aligner, and corresponds to the case of reading data from the memory cell located at a farther point than the far point of FIG. 12.

The low pulse of the input data DATA_I transmitted from the memory cell array located at a very distant distance from the first aligner (farther point) is delayed a lot while passing through the plurality of first mergers, and as shown in FIG. 13, may overlap with the logic high period of the control pulse PULSE of the next cycle (Cycle #(n+1)).

In this case, the first edge delay unit 180 delays the rising edge of the input data DATA_I having the low pulse to the falling edge of the control pulse PULSE of the next cycle (Cycle #(n+1)), which may deviate from the results of FIGS. 10 to 12 of delaying the rising edge of the input data DATA_I to the vicinity of the rising edge of the control pulse PULSE of the next cycle (Cycle #(n+1)).

In consideration of this point, an on-off signal ONOFF for controlling the operation of the first edge delay unit 180 may be added to the input of the second NAND gate 120 of the first edge delay unit 180.

When the delay in the input data is small as shown in FIGS. 10 to 12, logic high may be applied to the on-off signal ONOFF to enable the operation of the first edge delay unit 180, and when a large amount of delay is expected to occur in the input data as shown in FIG. 13, the operation of the first edge delay unit 180 may be disabled by applying logic low L to the on-off signal ONOFF.

When the on-off signal ONOFF is logic low L, the output of the second NAND gate 120 unconditionally becomes high, and the intermediate output data DATA_M that is the output of the first edge delay unit 180 becomes unconditionally equal to the input data DATA_I. When the on-off signal ONOFF is logic high, the operation of the first edge delay unit 180 is same as that described with reference to FIGS. 10 to 12.

In FIG. 13, the operation of the second edge delay unit 190 is almost the same as that of the second edge delay unit 190 in FIG. 11 or 12. That is, the second edge delay unit 190 delays the rising edge at which the input intermediate output data DATA_M changes from logic low to logic high while the inverted control pulse/PULSE is logic high, and outputs the rising edge as the first aligner output data DATA_O1 when the inverted control pulse/PULSE changes from logic high to logic low.

Since whether the memory cell is close to or far from the first aligner can be confirmed through the address transmitted from a host, a controller (not shown) may determine the logic of the on-off signal ONOFF based on the address of the memory cell to be accessed.

In FIGS. 10 to 13, the section with a thick line in the output data DATA_O1 of the first aligner corresponds to the section in which data is valid. As same as FIGS. 10 to 13, the section in which the data passing through the first aligner is valid is aligned by the edge of the control pulse regardless of which memory cell the data is transferred from.

Therefore, if the output of the first aligner is latched in synchronization with the control pulse, data may be safely accessed without skew even if the size of the cell array unit is increased or the number of cell array units in charge of the first aligning array is increased.

DDD

Figure 14:
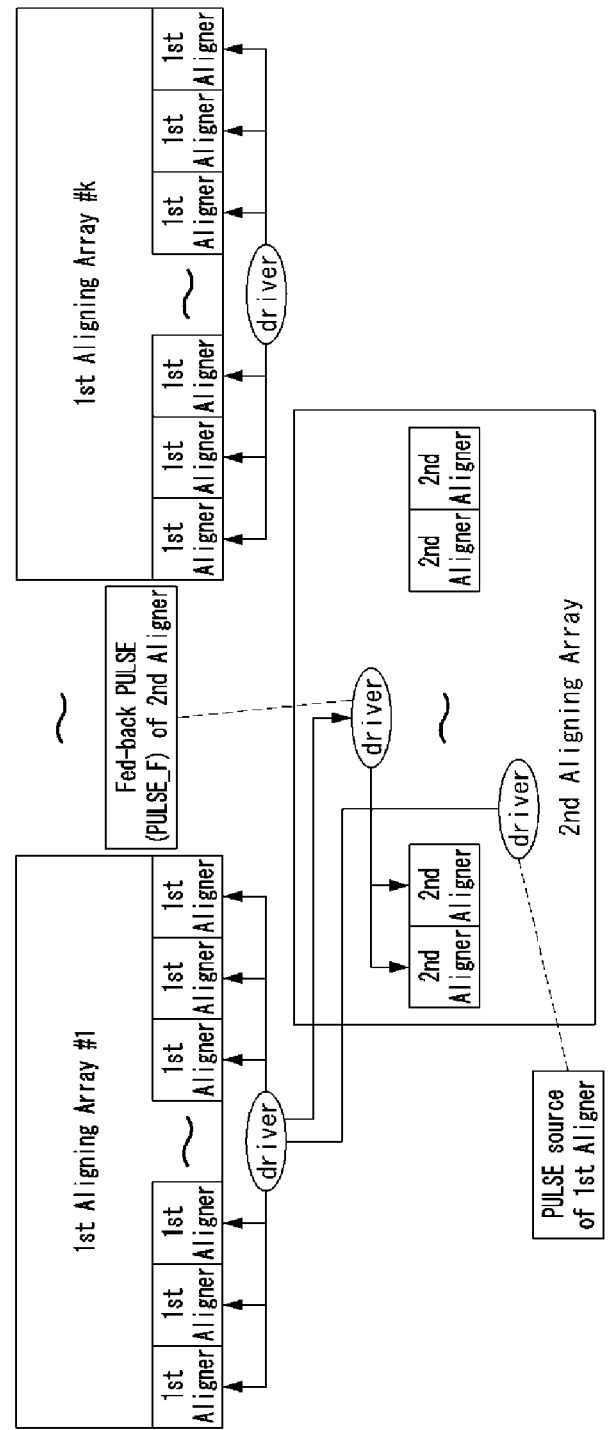
FIG. 14 shows the specific connection between a first aligner and a second aligner.

FIG. 14 shows the specific connection between a first aligner and a second aligner.

As shown in FIG. 4, the outputs of the plurality of first aligners (m in FIG. 4) are transmitted to the second aligner. The second merger is provided for each first aligner, and each second merger merges the output of the previous second merger with the output of the corresponding first aligner and outputs it to the next second merger.

As described with reference to FIGS. 10 to 13, the first aligner passes the data high DATA High of logic high among the input data input from the memory cell as it is, and delays the rising edge of the data low DATA Low having the low pulse in synchronization with the falling edge of the inverted control pulse/PULSE in which the control pulse PULSE is inverted and outputs the delayed rising edge.

The control pulses used in the first aligning array and the second aligning array must be interlocked. To this end, a predetermined driver generates the control pulse PULSE and supplies it to the first aligners in the first aligning arrays #1 to #2. In addition, the second aligners of the second aligning array may align the outputs of the plurality of first aligners by compensating for the delay difference between the output data of a far first aligner and the output data of a near primary aligner based on the feedback control pulse PULSE_F fed back from the first aligner.

Figure 15:
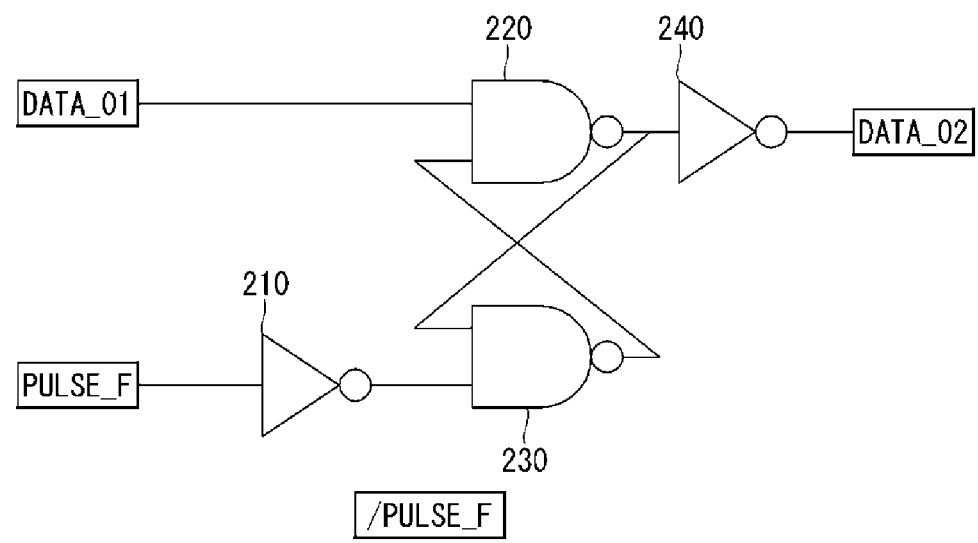
FIG. 15 shows the logic circuit of the second aligner included in the second aligning array of FIG. 14.

FIG. 15 shows the logic circuit of the second aligner included in the second aligning array of FIG. 14.

The output data DATA_O1 of the first aligner and the feedback control pulse PULSE_F are input to the second aligner 20. The fourth NOT gate 210 receives the feedback control pulse PULSE_F and outputs an inverted feedback control pulse/PULSE_F, and the fifth NAND gate 220 receives the output data DATA_O1 of the first aligner and the output of the sixth NAND gate 230, The sixth NAND gate 230 receives the inverted feedback control pulse/PULSE_F, which is the output of the fourth NOT gate 210, and the output of the fifth NAND gate 220, and the fifth NOT gate 240 receives the output of the fifth NAND gate 220 and outputs the second aligner output data DATA_O2.

The second aligner is in the form of excluding the first edge delay unit 180 from the first aligner and has the same operation as the second edge delay unit 190 of the first aligner.

Figure 17:
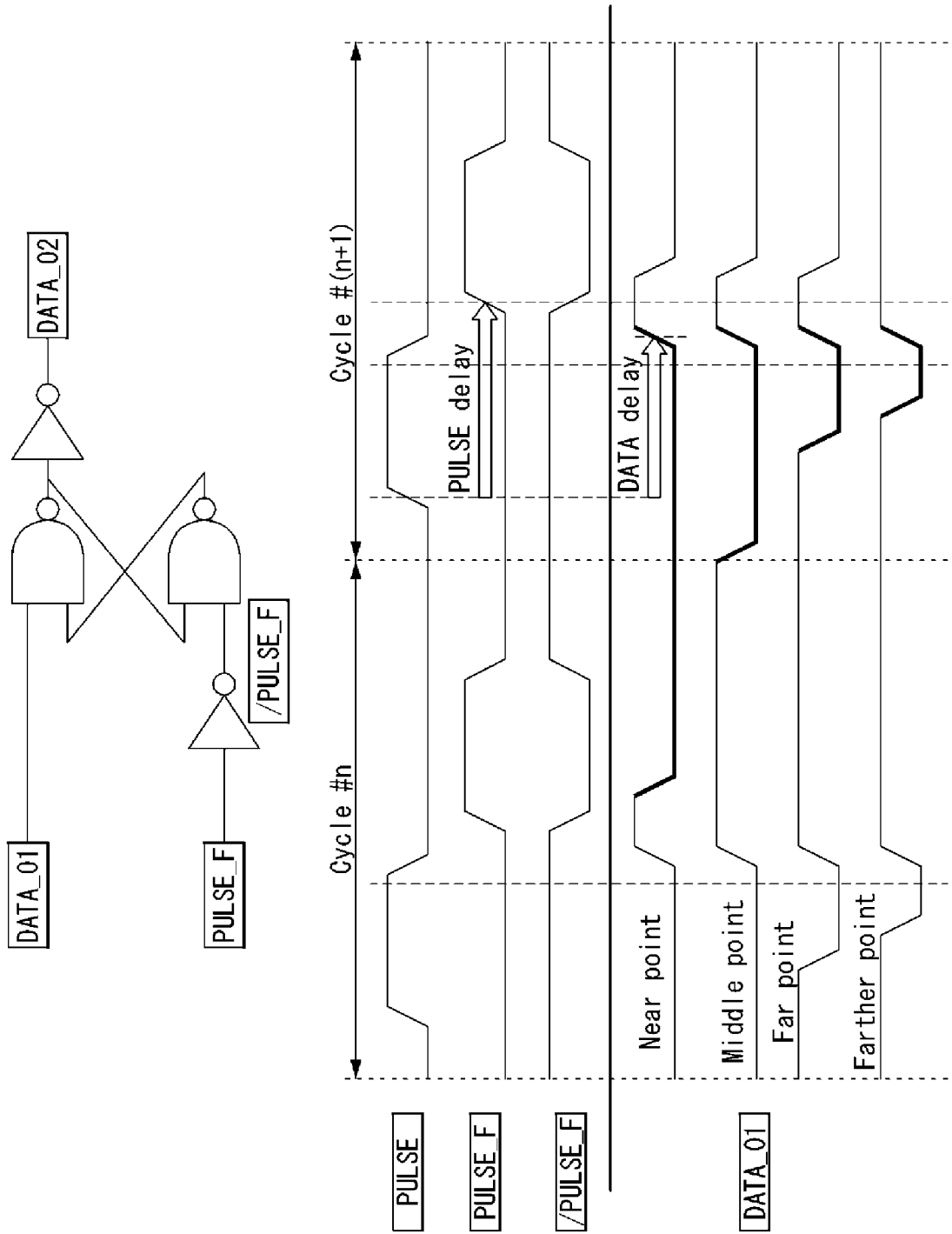
FIG. 17 shows another timing of data input from the first aligner to the second aligner according to the distance from the second aligner.

FIG. 16 shows the timing of data input from the first aligner to the second aligner according to the distance from the second aligner, and FIG. 17 shows another timing of data input from the first aligner to the second aligner according to the distance from the second aligner.

The second aligning array and data register are arranged together to latch the data of the second aligning array and store it in the data register. In this case, the control pulse used by the second aligning array can be used.

The second aligner uses the feedback control pulse PULSE_F returned from the first aligner to align the output of the first aligner. That is, for a more stable operation, the second aligner aligns data output from the first aligner using the feedback control pulse PULSE_F replicated similar to the delay along the output signal path of the first aligner.

In FIGS. 16 and 17, the interval between the feedback control pulse PULSE_F and the control pulse PULSE corresponds to the control pulse delay, and the interval from the rising edge of the control pulse PULSE to the rising edge of the output data DAGTA_O1 of the first aligner input to the second aligner corresponds to the data delay.

For example, if the control pulse delay (PULSE delay) is smaller than the data delay (DATA delay) when the data register disposed together with the second aligning array latches data using the rising edge of the feedback control pulse PULSE_F, there is no problem because the output data DATA_O1 of the first aligner maintains a valid value at the rising edge of the feedback control pulse PULSE_F.

However, as shown in FIG. 17, if the control pulse delay (PULSE delay) is greater than the data delay (DATA delay), the problem may occur that the output data (DATA_O1) of the first aligner fails to maintain a valid value at the rising edge of the feedback control pulse PULSE_F.

Since the distance between the data register and the first aligning array is much shorter than the distance between the first aligning array and the cell array unit, there is little possibility that a problem as in FIG. 17 will occur. Thus, the second aligner may be unnecessary. However, in case the problem like FIG. 17 occurs, the second aligner as shown in FIG. 15 may be provided.

Figure 18:
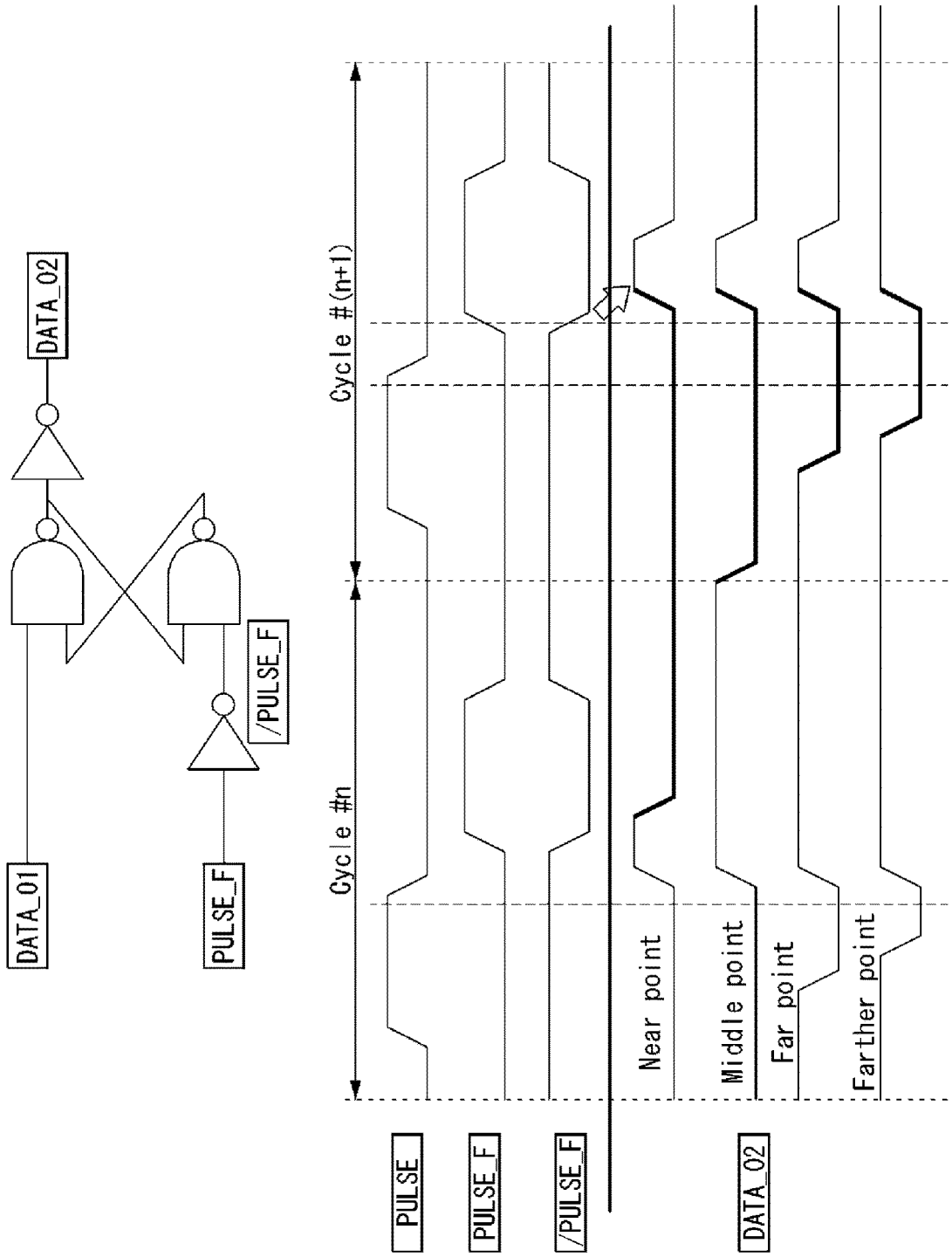
FIG. 18 shows the results of processing data output from the first aligner by the second aligner according to the distance from the second aligner.

FIG. 18 shows the results of processing data output from the first aligner by the second aligner according to the distance from the second aligner.

While the inverted feedback control pulse/PULSE_F is logic high, the second aligner outputs the output data DATA_O1 of the first aligner as it is in FIG. 17 as the output data DATA_O2, and, even if DATA_O1 changes from logic low to logic high, continues to output logic low as the output data DATA_O2 without reflecting it in the output data DATA_O2.

Thereafter, as shown in FIG. 18, the second aligner outputs the output data DATA_O2 that rises from logic low to logic high when the inverted feedback control pulse/PULSE_F falls from logic high to logic low.

Accordingly, regardless of the distance from the memory cell, data read from the memory cell is aligned with the falling edge of the inverted feedback control pulse/PULSE_F or the rising edge of the feedback control pulse PULSE_F.

Thereafter, the data register latches and stores the output data of the second aligner aligned to the rising edge of the feedback control pulse PULSE_F in synchronization with the feedback control pulse PULSE_F, thereby solving the skew problem caused by the data delay according to the location of the memory cell.

On the other hand, unlike the data waveform of FIG. 6, data bit '0' is set to logic low, data bit '1' is set to the form of a high pulse, and the first aligner of FIG. 8 may be modified to pass through the logic low as it is, to delay the falling edge of the high pulse in synchronization with the edge of the control pulse and to output the delayed falling edge.

Alternatively, when one of the data bits '0' and '1' is in the form of the pulse of a first logic level and the other is in the form of the DC of a second logic level, a modified first aligner may pass the second logic level as it is and output the edge changing from the first logic level to the second logic level in the pulse with a delay in synchronization with the edge of the control pulse.

As described above, by disposing one aligning array for a plurality of memory cell units without disposing a data register for each memory cell unit, it is possible to reduce the size of the memory device while disposing memory cell units of the same size, and also reduce power consumption.

Also, even if the difference in data delay increases depending on the location of the memory cell to be accessed due to the increase in the number of memory cell units in charge of the aligning array, by using the aligner it is possible to align the section in which data is valid regardless of the location of the memory cell from which data is to be read, thereby stably managing skew.

INDUSTRIAL APPLICABILITY

Hereinabove, the preferred embodiments of the present disclosure are disclosed for an illustrative purpose and hereinafter, modifications, changes, substitutions, or additions of various other embodiments will be made within the technical spirit and the technical scope of the present disclosure disclosed in the appended claims by those skilled in the art.

The invention claimed is:

1. A memory device comprising:
a memory cell array in which memory cells are connected to word lines and bit lines in a matrix form;
a plurality of mergers connected in series to transmit data that is read from a selected memory cell from among the memory cells included in the memory cell array and transformed into one of a direct current form and a pulse form; and
an aligner configured to delay an edge of first output data output by one of the plurality of mergers in synchronization with an edge of a control pulse, wherein first data which is one of data bit '0' and data bit '1' is input to the merger in the direct current form of first logic and second data which is the other of the data bit '0' and the data bit '1' is input to the merger in the pulse form in which the first logic is changed through second logic back to the first logic.

2. The memory device of claim 1, wherein the merger outputs data by merging output of a previous merger and output of a corresponding sense amplifier.

3. The memory device of claim 1, wherein when the first data is input, the aligner passes the first data to output the direct current form of the first logic as second output data, and when a first edge changing from the second logic to the first logic, the aligner outputs the first edge with a delay as the second output data in synchronization with a rising edge or a falling edge of the control pulse.

4. The memory device of claim 1, wherein the aligner includes first and second edge delay units connected in series,
wherein the first edge delay unit receives the first output data and the control pulse as inputs, delays a first edge occurring in the first output data during the control pulse is at the first logic, and outputs the first edge as intermediate data when the control pulse changes from the first logic to the second logic, and
wherein the second edge delay unit receives the intermediate data and an inverted control pulse inverting the control pulse as inputs, delays the first edge occurring in the intermediate data during the inverted control pulse is at the first logic, and outputs the first edge as second output data when the inverted control pulse changes from the first logic to the second logic.

5. The memory device of claim 4, wherein the first logic is logic high and the second logic is logic low,
wherein the first edge delay unit includes a first NAND gate receiving the first output data and output of a second NAND gate as inputs, the second NAND gate receiving the control pulse and output of the first NAND gate as inputs, and a first NOT gate inverting the output of the first NAND gate to output the intermediate data, and
wherein the second edge delay unit includes a third NAND gate receiving the intermediate data and output of a fourth NAND gate as inputs, the fourth NAND gate receiving the inverted control pulse and output of the third NAND gate as inputs, and a second NOT gate inverting the output of the third NAND gate to output the second output data.

6. The memory device of claim 5, wherein the second NAND gate further receives an on-off control signal enabling or disabling an operation of the first edge delay unit as the inputs, and
wherein the on-off control signal is input as logic low when a requested address of a memory cell is relatively far from the aligner.

7. The memory device of claim 1, further comprising:
a plurality of memory cell arrays;
a plurality of first aligner arrays comprising a plurality of aligners each of which is connected to one of the memory cells and a plurality of second mergers each of which is connected a corresponding one of the plurality of aligners; and
a second aligner array comprising a plurality of second aligners each of which is connected to one of the plurality of second mergers included in one among the plurality of first aligner arrays.

8. The memory device of claim 7, wherein the second aligner delays an edge of second output data output from a corresponding second merger by using a feedback control pulse fed back from the plurality of aligners included in the plurality of first aligner arrays.

9. The memory device of claim 8, wherein the second aligner receives the second output data and the feedback control pulse as inputs, passes the first data as it is to output the first data as third output data of the direct current form of the first logic when the first data is input as the second output data, delays the first edge occurring in the second output data during an inverted feedback control pulse inverting the feedback control pulse is the first logic, and outputs the first edge as the third output data when the inverted feedback control pulse changes from the first logic to the second logic.

10. The memory device of claim 9, wherein the second aligner comprises a fourth NOT gate inverting the feedback control pulse to output the inverted feedback control pulse, a fifth NAND gate receiving the second output data and output of a sixth NAND gate as inputs, the sixth NAND gate receiving the inverted feedback control pulse and output of the fifth NAND gate as inputs, and a fifth NOT gate inverting the output of the fifth NAND gate.

11. The memory device of claim 9, wherein the second merger comprises a seventh NAND gate receiving output of a previous second merger and output of a corresponding aligner as inputs, and a sixth NOT gate inverting output of the seventh NAND gate.

* * * * *